United States Patent [19]

Harmon

[11] Patent Number: 4,706,097
[45] Date of Patent: Nov. 10, 1987

[54] NEAR-LINEAR SPRING CONNECT STRUCTURE FOR FLEXIBLE INTERCONNECT CIRCUITS

[75] Inventor: John P. Harmon, Vancouver, Wash.

[73] Assignee: Hewlett Packard Company, Palo Alto, Calif.

[21] Appl. No.: 848,366

[22] Filed: Apr. 3, 1986

[51] Int. Cl.⁴ .............................................. G01D 15/24
[52] U.S. Cl. ............................ 346/139 C; 346/140 R; 439/492
[58] Field of Search ............... 346/1.1, 140, 139 C; 339/95 R, 75 M, 61 M, 17 F, 176 MF; 439/492

[56] References Cited

U.S. PATENT DOCUMENTS 4,116,517  9/1978  Selvin .......................... 339/61 M X

OTHER PUBLICATIONS

Buck, Roy T.; Printhead Interconnect, Hewlett-Packard Journal, vol. 36, No. 5, May 1985, p. 14.

Primary Examiner—Joseph W. Hartary
Attorney, Agent, or Firm—William J. Bethurum

[57] ABSTRACT

A printhead for a thermal ink jet printer or the like is brought into good electrical contact with raised electrical contacts on a flexible interconnect circuit by the use of a molded near-linear spring connect structure. This novel structure includes a horizontal central locating member from which a plurality of resilient hollow cylinders extend vertically upward and in alignment with the electrical contacts on the flexible interconnect circuit. Since there is a near-linear deflection of the cylinder walls with increasing force applied thereto, good electrical contact is achieved between the printhead and the flex circuit using a minimum of force, thereby minimizing the likelihood of damage to the printhead.

4 Claims, 6 Drawing Figures

NEAR-LINEAR SPRING CONNECT STRUCTURE FOR FLEXIBLE INTERCONNECT CIRCUITS

TECHNICAL FIELD

This invention relates generally to the electrical interconnection of flexible (flex) circuits and more particularly to such interconnects which are especially adapted for making external electrical connections to thermal ink jet printheads.

BACKGROUND ART

In the manufacture of thin film resistor substrates for thermal ink jet printheads, it is known to provide heater resistors on a common substrate, such as silicon, and employ these resistors to transfer thermal energy to corresponding adjacent ink reservoirs during a thermal ink jet printing operation. This thermal energy will cause the ink in the reservoirs to be heated to boiling and thereby be ejected through an orifice in an adjacent nozzle plate from which it is directed onto a print medium. During such operation, there heater resistors are electrically pulsed by current applied thereto via conductive traces formed on top of the silicon substrate and insulated therefrom by an intermediate dielectric layer. The formation of this layer, the formation of the resistive layer for the heater resistors, and the aluminum evaporation or sputtering process for forming electrical patterns of conductive trace material to the heater resistors are all well known in the art and therefore are not described in further detail herein. However, for a further discussion of the varoius processes used in the fabrication of thermal ink jet printheads, reference may be made to the *Hewlett Packard Journal*, Volume 36, Number 5, May 1985, incorporated herein by reference.

In order to provide electrical connections between external pulse drive circuits and these conductive traces on the thermal ink jet printhead, it has been a common practice to employ so called flexible or "flex" circuits to make removeable pressure contacts to certain conductive terminal pads on the thin film resistor printhead substrate. For this connection it becomes necessary to provide means by which pressure can be applied to the flexible circuit so that the electrical leads therein make good electrical connection with corresponding mating pads on the thin film resistor substrate.

The flexible circuit will typically consist of a photolithographically defined conductive pattern which has been formed by metal evaporation or sputtering and etching processes carried out on a thin flexible insulating substrate member. These electrical contact locations on the flex circuit will be raised slightly in a bump and dimple configuration, and this geometry may be achieved by the use of a "bed of nails" punch structure which match the location of the dimples. This structure is used to punch the electrical contact locations on the flex circuit to a raised location above the surface of the insulating substrate member thereof.

During this latter punch process, it sometimes happens that not all of the raised contact bumps in the flexible circuit are moved the same distance above the insulating substrate surface. For this reason, more force is necessary to make contact with the smaller or lower-height bumps than those higher bumps more extended from the surface of the flex circuit.

One approach to providing the necessary force to the flex circuit and the necessary pressure contact between the flex circuit and conductive pads on the thin film resistor substrate is to use an elastomeric material, such as rubber, which has been preformed to have a plurality of cones spaced at locations corresonding to the location of the dimples in the flex circuit. In this manner, the tips of these cones can be inserted into the dimples of the flex circuit and urged thereagainst with a force sufficient to bring the conductive bumps on the flex circuit in to good physical and electrical contact with the terminal pads on the thin film resistor substrate.

While the above prior art approach to making electrical contact between the flex circuit and the print-head substrate has proven satisfactory for certain types of interconnect patterns with few interconnect members, it has not been entirely satisfactory for connecting larger numbers of conductive traces to larger numbers of conductive bumps or pads on the flex circuit. This fact has been a result of the nature of the nonlinear deflection of the above elastomeric cones. This nonlinear deflection of the elastomeric cones is seen as a nonlinear variation in cone volumetric compression, $V_c$, as a function of the distance, D, that the tip of the cone is moved during an interconnect operation. Thus, this nonlinear characteristic tends to increase the amount of force which must be applied to the flex circuit in order to insure that all the bumps on the flex circuit make good electrical contact with the conductive traces or terminal pads on the printhead substrate. In some cases this required force is sufficiently large to fracture the substrate or do other structural damage thereto. This non-linear deflection characteristic of the prior art is described in more detail below with reference to the prior art FIGS. 1A and 1B.

DISCLOSURE OF INVENTION

The general purpose of this invention is to reduce the amount of force required to insure good electrical contact between a flex circuit and a thin film resistor substrate for a thermal ink jet printhead. To accomplish this purpose, I have discovered and developed a novel, nearly-linear spring connect structure for placing the flex circuit into good electrical contact with contact pads on the printhead substrate with a minimum of force applied thereto. This structure includes a central locating member having a plurality of cylinders extending integrally therethrough and therefrom to a predetermined distance from each major surface of the central locating member. In a preferred embodiment of the invention, cone-shaped tips are located at upper ends of the elastomeric deflectable cylinders and are inserted into dimples of the flexible circuit with a force sufficient to bring the electrical bumps or pads above the dimples into good electrical contact with mating conductive contact pads on the printhead substrate. During this process, the volumetric deformation of the cylinders varies substantially linearly as a function of the force applied to the lower ends of these cylinders, and this feature enables the vertical displacement of the cylinder walls to be maximized for a given force applied to these cylinders. In a preferred embodiment, the cylinders are hollow and are made of rubber or other like elastomeric material.

BEST MODE FOR CARRYING OUT THE INVENTION

Figure 1A:
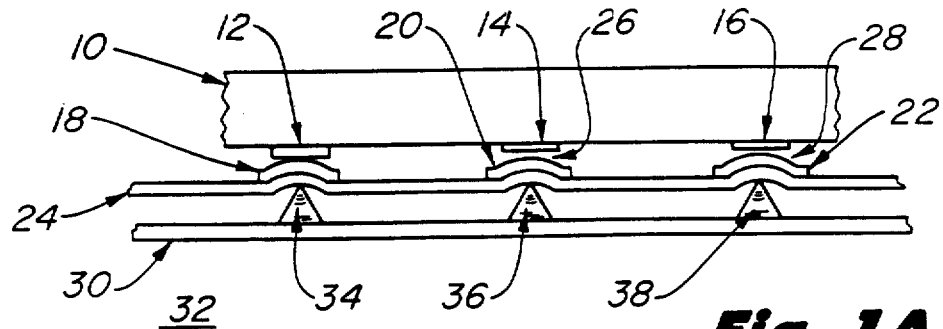
FIGS. 1A and 1B illustrate the cone shaped spring interconnect structure to the prior art.

Referring now to FIG. 1A, there is shown schematically a thin film resistor printhead substrate 10 which has been fabricated using state-of-the-art semiconductor processing technique and includes a plurality of electrically conductive pads 12, 14 and 16 thereon. It is desired to connect these pads 12, 14 and 16 to a corresponding plurality of flex pads 18, 20 and 22 on a flexible or "flex" circuit member 24. The flex circuit member 24 will typically consist of a thin flexible insulating member of a material such as Mylar upon which a conductive pattern has been deposited thereon and etched in a given geometry so that the conductive pads 18, 20 and 22 will be formed thereon at a desired spacing as shown.

As previously mentioned, during the creation of the contour of the conductive pads 18, 20 and 22 and the corresponding underlying dimples in the flex circuit 24, using a bed-of-nails punch-type of press or the like, it frequently happens that while one pad 18 may be pressed upwardly to a desired height, other pads 20 and 22 will not be so raised. Thus, gaps 26 and 28 are left between the tops of the pads 20 and 22 and the surfaces of the conductive pads 14 and 16 prior to being forced further upwardly by an additional force applied to the base 30 of the non-linear cone-type interconnect spring structure 32 of the prior art. This structure 32 will typically have a plurality of elastomeric cones 34, 36 and 38 which extend vertically upward as shown. The cones 34, 36, and 38 of the prior art structure 32 have typically been molded of rubber and are of solid construction.

Figure 1B:
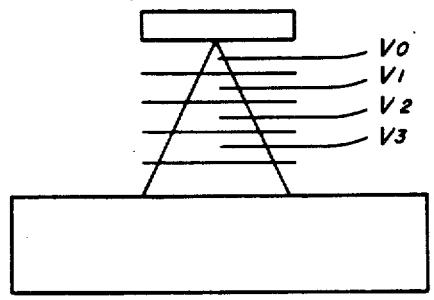
Figure 2:
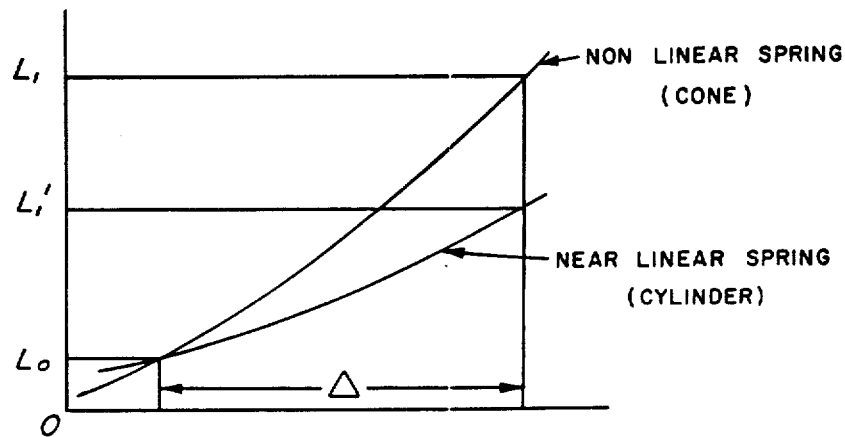
FIG. 2 is a graph illustrating the linear versus nonlinear variations in volumetric displacement of the cylinder and cone configurations, respectively, as a function of the variation in distance of compression of these members.

As indicated in FIG. 1B, as each cone 34, 36 and 38 is deflected downwardly, each succeeding volume $V_0$, $V_1$, $V_2$ and $V_3$ becomes increasingly larger. Furthermore, this increasing volumetric relationship varies geometrically and therefore leads to a very nonlinear spring as indicated by the curve in FIG. 2. With a nonlinear spring, the load $L_1$ increases rapidly with an increasing cone tip displacement or height variation, indicated as delta, $\Delta$. This characteristic is undesirable because it leads to larger and heavier interconnect parts, and it sometimes produces creep in the substrate material and sometimes causes breakage or fracture of the thin film resistor substrate. On the other hand, a near linear spring provides a lower final load $L_1$ which is sufficient to bring all contact pads on the flex circuit into contact with corresponding terminal contact pads on the thin film resistor substrate. This feature thus enables both the number and packing density of the contact pads on the printhead and the contact pads on the flex circuit to be substantially increased as a result of the now reliable assurance that all mating contact pads will make good electrical contact. This improved reliability of good electrical contact for all closely spaced mating contact pads on the printhead and flex circuit will be better understood from the following description of FIGS. 3A, 3B and FIG. 4.

Figure 3A:
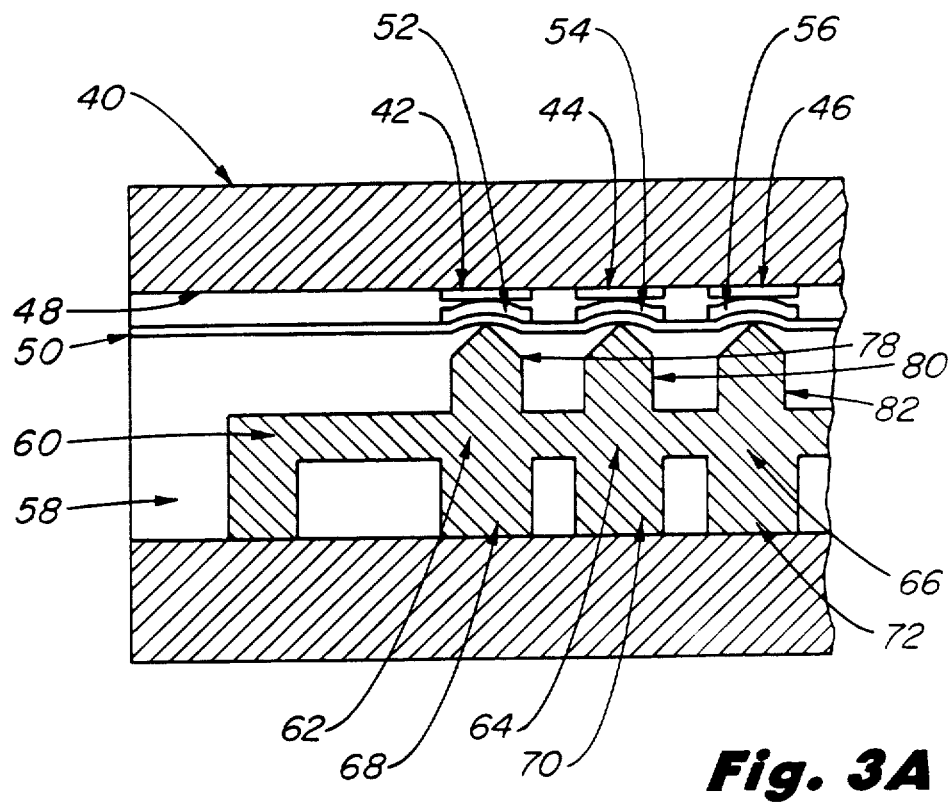
FIG. 3A is a schematic representation of the spring connect structure-flex circuit-printhead interconnect scheme of the present invention.
Figure 3B:
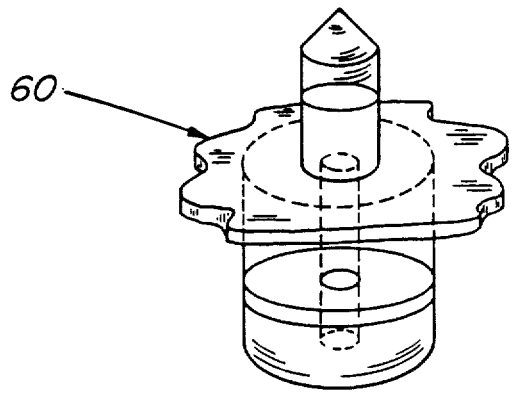
FIG. 3B is an enlarged isometric view of one of the cylindrical interconnects of FIG. 3A.

Referring now to FIG. 3A, there is shown a printhead 40, which may for example be a thin film resistor type printhead having contact pads 42, 44, and 46 on the lower surface thereof. A flexible circuit member 50 having a conductive pattern thereon has been brought into alignment with the substrate 40 as shown, with contact pads 52, 54 and 56 of the flex circuit pattern being aligned with the contact pads 42, 44, and 46 on the printhead 40, respectively.

A near-linear spring contact structure is generally designated 58 and includes a horizontal central locating member 60 and a plurality of hollow rubber cylinders 62, 64 and 66 which extend therethrough as shown. The cylinders 62, 64 and 66 include lower cylindrical sections 68, 70 and 72 which extend downwardly and come to rest on a rigid base support member 76. The spring connect structure 58 further includes a plurality of upper, partially cylindrical and partially conical sections 78, 80 and 82 with conical tips which are brought into alignment with the underside of the dimples in the flex circuit 50. This partially cyclindrical and partially conical (tip) configuration is better seen in the enlarged isometric view of FIG. 3B wherein the cylindrical structure on the topside of the central locating member 60 is of solid construction and on the underside of member 60 is of hollow construction.

Figure 4:
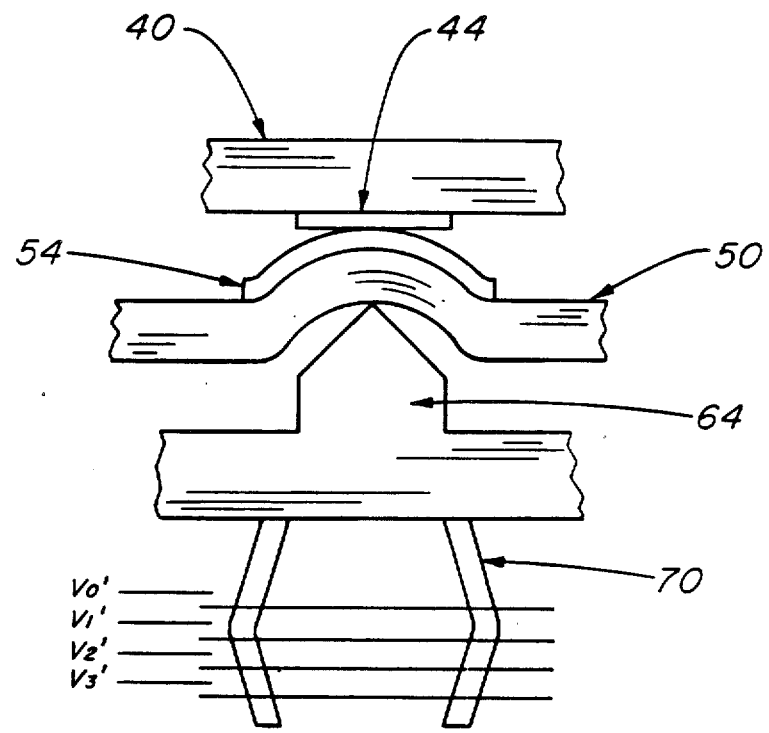
FIG. 4 is an enlarged cross section view of the compression and bulging of the cylindrical walls (exaggeratedly spaced) of the elastomeric cylinders of the spring connect structure of FIGS. 3A and 3B.

Referring now to FIG. 4, a rubber cylinder such as cylinder 68 will undergo a slight bulge as indicated when forces are applied vertically to the spring connect structure 58 to urge the flexible circuit 58 into electrical contact with the contact pads 52, 54 and 56 on the printhead 40. Ideally, each successive displaced volume equals the last, i.e. $V_0' = V_1' = V_2' = V_3'$. However, because the walls of the cylinder 68 bulge slightly as indicated, the successive volume displacements are not exactly equal, and this reaction leads to a spring which is nearly linear, rather that precisely linear. However, the cylindrical shape is the most nearly linear spring which can be manufactured at a minimum cost and which yields the near linear load versus distance curve in FIG. 2. This spring connect structure 58 is capable of bringing all pads 52, 54 and 56 into contact with all corresonding contact pads 42, 44 and 46 on the printhead 40 after applying a minimum force of approximately $L_1'$ shown in FIG. 2, as contrasted to the much greater force $L_1$ for the nonlinear spring of the prior art shown in FIGS. 1A and 1B.

Various modifications may be made to above described embodiment without departing from the scope of the present invention. For example, the cylindrical columns may be either solid or hollow. In addition, the present invention is not limited to the electrical connection of flexible circuits to ink jet printheads, but may be used for the connection of flex circuits to other equivalent small geometry electronic devices having small contact pads thereon to which removable pressure connections need be made.

INDUSTRIAL APPLICABILITY

The present invention is used for the removable electrical connection of flexible interconnect circuits to thermal ink jet printheads or other small electronic devices requiring such removable connection. These printheads are used for controlling the ejection of ink from a thermal ink jet printer during a high speed printing operation.

What is claimed is:

1. A near-linear spring connect structure comprising: a horizontal central locating member and a plurality of resilient cylinders extending integrally therethrough or therefrom a predetermined distance from the major surfaces of said central locating member, said cylinders spaced laterally apart by predetermined distances corresponding to predetermined dimensions on a flexible interconnect circuit at which electrical contact areas are located, whereby tips of said cylinders may be brought into forcible contact with said interconnect circuit to urge said interconnect circuit into electrical contact with another aligned electronic structure, and the volume displacement within said cylinders as a result of force being applied thereto is nearly linear with respect to said force and thereby enables the vertical displacement of said cylinders to be maximized for a given force applied thereto, thereby minimizing the required force applied to said electronic structure.

2. The structure defined in claim 1 wherein said cylinders are made of rubber and have either a hollow volume or a solid volume bonded by cylindrical walls extending normal to a major surface of said central locating member.

3. A method of making forced, yet removeable, contact between a printhead of the like having a plurality of contact pads or areas thereon and a flexible interconnect circuit having a corresponding plurality of contact pads and dimples thereon which comprises:

a. bringing said pads and dimples of said flexible interconnect circuit into alignment with said connect pads on said printhead, b. providing a central locating member having a plurality of resilient cylinders extending integrally and perpendicularly therefrom and being laterally spaced at distances corresponding to the spacings between said pads and dimples on said flexible circuit, and c. forcing the ends of said cylinders against said dimples in said flexible circuit, whereby the volume displacement of said cylinders as a result of force applied thereto is nearly linear and thereby enables the vertical displacement of said cylinders to be maximized for a given applied force.

4. A process for increasing both the number and packing density of mating contact pads on both an electronic substrate and a facing flexible circuit, respectively, which comprises the steps of:

a. alignming a plurality of contact pads on a flexible circuit with a matching plurality of contact pads on an electronic substrate, and b. urging a mating plurality of elastomeric cylinders against said plurality of contact pads on said flexible circuit, whereby the near-linear spring displacement of said electromeric cylinders tends to minimize the amount of force required to drive all mating contact pads on said substrate and flexible circuit into electrical contact, and the lowering of such contact force enables the number and packing density of contact pads to be maximized.

* * * * *

UNITED STATES PATENT AND TRADEMARK OFFICE
CERTIFICATE OF CORRECTION

PATENT NO. : 4,706,097

DATED : November 10, 1987

INVENTOR(S) : John P. Harmon

It is certified that error appears in the above-identified patent and that said Letters Patent is hereby corrected as shown below:

Column 2, line 66 , delete "to", insert --of--;

column 4, line 45, delete "corresonding", insert --corresponding--;

column 5, line 28, delete "of", insert --or--;

column 6, line 2, delete "connect", insert --contact--;

column 6, line 20, delete "alignming", insert --aligning--;

column 6, line 26, delete "electromeric", insert --elastomeric--.

Signed and Sealed this

Fifth Day of July, 1988

Attest:

DONALD J. QUIGG

Attesting Officer

Commissioner of Patents and Trademarks